(12) United States Patent
McCoy

(10) Patent No.: US 11,196,098 B2
(45) Date of Patent: Dec. 7, 2021

(54) SYSTEMS AND PROCESSES FOR ASSESSING ELECTROCHEMICAL CELL QUALITY

(71) Applicant: CAMX POWER, LLC., Lexington, MA (US)

(72) Inventor: Christopher H. McCoy, Sherborn, MA (US)

(73) Assignee: CAMX Power LLC, Lexington, MA (US)

(*) Notice: Subject to any disclaimer, the term of this patent is extended or adjusted under 35 U.S.C. 154(b) by 0 days.

(21) Appl. No.: 16/348,666

(22) PCT Filed: Nov. 10, 2017

(86) PCT No.: PCT/US2017/061056
§ 371 (c)(1),
(2) Date: May 9, 2019

(87) PCT Pub. No.: WO2018/089763
PCT Pub. Date: May 17, 2018

(65) Prior Publication Data
US 2019/0326650 A1    Oct. 24, 2019

Related U.S. Application Data

(60) Provisional application No. 62/420,053, filed on Nov. 10, 2016.

(51) Int. Cl.
*H01M 10/42* (2006.01)
*G01R 31/3835* (2019.01)
(Continued)

(52) U.S. Cl.
CPC .... *H01M 10/4285* (2013.01); *G01R 31/3835* (2019.01); *H01M 10/44* (2013.01); *H01M 10/482* (2013.01)

(58) Field of Classification Search
CPC ............ H01M 10/4285; H01M 10/44; H01M 10/482; H01M 10/0525; G01R 31/3835;
(Continued)

(56) References Cited

U.S. PATENT DOCUMENTS

| 4,647,860 A * | 3/1987 | Marshall | G01R 31/396 324/433 |
| 5,952,815 A * | 9/1999 | Rouillard | H02J 7/0016 320/116 |

(Continued)

FOREIGN PATENT DOCUMENTS

| CN | 103105588 A | 5/2013 |
| DE | 3438783 C1 | 12/1985 |

(Continued)

OTHER PUBLICATIONS

International Search Report for PCT/US2017/061056 dated Feb. 27, 2018.
(Continued)

*Primary Examiner* — Akm Zakaria
(74) *Attorney, Agent, or Firm* — Dinsmore & Shohl LLP; Weston R. Gould

(57) ABSTRACT

A process and system for measuring internal faults in an electrochemical cell. The process for detecting an internal fault in an electrochemical cell includes measuring a voltage difference or a rate of change in voltage difference between a common terminal of a first electrochemical cell and a second electrochemical cell. The measuring is a time measurement. The first electrochemical cell or second electrochemical cell is accepted based on the measuring, or first electrochemical cell or second electrochemical cell is rejected based on the measure of the internal fault of the electrochemical cell.

3 Claims, 5 Drawing Sheets

(51) Int. Cl.
 *H01M 10/44* (2006.01)
 *H01M 10/48* (2006.01)
(58) Field of Classification Search
 CPC ................ G01R 31/396; G01R 31/388; G01R 31/3865; G01R 31/50; G01N 27/20
 See application file for complete search history.

(56) References Cited

U.S. PATENT DOCUMENTS

| | | |
|---|---|---|
| 2007/0259256 A1 | 11/2007 | Le Canut et al. |
| 2009/0121721 A1 | 5/2009 | Doepke et al. |
| 2012/0182021 A1 | 7/2012 | McCoy et al. |
| 2013/0029245 A1* | 1/2013 | Fisher ............... H01M 8/04552 429/467 |
| 2013/0323553 A1 | 12/2013 | Bergmann |
| 2014/0266229 A1 | 9/2014 | McCoy |
| 2015/0191102 A1 | 7/2015 | Kubo et al. |
| 2016/0111758 A1 | 4/2016 | Stimm |
| 2016/0336623 A1* | 11/2016 | Nayar ................... H02J 7/0068 |

FOREIGN PATENT DOCUMENTS

| | | |
|---|---|---|
| EP | 3035067 A1 | 6/2016 |
| JP | 2003-157911 A | 5/2003 |
| JP | 2009-145137 A | 7/2009 |
| JP | 2010-231948 A | 10/2010 |
| JP | 2013-185861 A | 9/2013 |
| WO | 99-05537 A2 | 2/1999 |
| WO | 2015/058165 A1 | 4/2015 |

OTHER PUBLICATIONS

English translation of DE3438783C1.
Machine English translation of CN103105588A.

* cited by examiner

SYSTEMS AND PROCESSES FOR ASSESSING ELECTROCHEMICAL CELL QUALITY

CROSS-REFERENCE TO RELATED APPLICATIONS

This application is the U.S. National Stage of PCT/US2017/061056 filed Nov. 10, 2019, and which claims priority to U.S. Provisional Patent Application Ser. No. 62/420,053 filed Nov. 10, 2016, each of which is incorporated by reference herein in its entirety.

STATEMENT OF GOVERNMENT SPONSORSHIP

This disclosure was made with government support under contract no. HQ014715C8004, awarded by the United States Missile Defense Agency. The government has certain rights in the invention.

TECHNICAL FIELD

This disclosure generally relates to the evaluation of electrochemical cells such as evaluating for the presence or absence of one or more internal faults, and more particularly to evaluation of cells for the purpose of detecting internal short circuits in electrochemical cells.

BACKGROUND

Lithium-ion cells are used as power sources in a broad range of applications ranging from consumer electronics to HEV/PHEV/EV drivetrains. Safety risks associated with this battery chemistry include the possibility of catastrophic cell failure triggered by internal short circuits in cells. To reduce the likelihood of such safety failures, cell manufacturers employ quality control characterization protocols in which cells are allowed to reside at rest for some number of days or weeks to screen for the presence of abnormally high self-discharge that might indicate an internal fault such as internal short. Such aging protocols are administered in the factory immediately following cell assembly.

The aging step is presently required to assess cell quality and to screen for internal short circuits that not only reduce cell performance, but in rare cases, can result in subsequent violent cell failure. The aging step typically involves examining changes in the open circuit voltage across the terminals of a single cell over the course of the aging period. Cells that show a decline in voltage greater than a certain level may be rejected. The testing methodology of looking at changes in open circuit voltage that may indicate the presence of an internal short is relatively insensitive and, accordingly, requires a significant period of time (e.g., typically 7 to 28 days) for unambiguous detection of internal short circuits. Stable open circuit voltage indicates a cell that is free of significant internal short circuits while a decline in open circuit voltage greater than some pre-determined threshold is taken to indicate the presence of an abnormally high rate of self-discharge or of the presence of an internal short.

In order to be detectable, internal shorts should produce a sufficient impact on cell voltage decay to cross the threshold of detection using the traditional detection processes, i.e., produce a voltage decay that is definitely greater than that seen in normal, short-free cells. This screening process is time consuming and invariably dominates total cycle time in the manufacture of lithium-ion cells.

SUMMARY

Ongoing need exist to create a system and screening process to quickly and efficiently detect internal fault in an electrochemical cell. Screening for the internal faults may take weeks or months to test, and the testing procedures may drain the electro-potential of cell. One solution to address the problems in current electrochemical cell test procedures is measuring the voltage differential between two or more cells to determine the presence or absence of internal short circuits, self-discharge, or other faults. The systems and processes in this disclosure are provided to assess cell quality, including identifying the presence of internal short circuit(s) or unacceptably high rates of self-discharge in batteries, and that are applicable to cells of any chemistry and of any capacity. Some embodiments of the systems and processes of this disclosure allow internal faults in cells, such as internal shorts, to be detected more rapidly, such that less than 1% of the time period of commonly employed prior methods is required, and with greater sensitivity than using prior techniques.

In some embodiments, processes for detecting one or more internal faults in an electrochemical cell include measuring a voltage difference or a rate of change in voltage difference between a test terminal of a first electrochemical cell and a test terminal of a second electrochemical cell where the test terminals have the same polarity. The voltage difference or rate of change in the voltage difference is measured for a test period that may be referred to herein as a measurement time or time under which the voltage is measured. Based on the voltage difference measurement, the first electrochemical cell or second electrochemical cell is accepted. When an internal fault in the electrochemical cell is detected by measuring the voltage difference, the electrochemical cell is rejected.

In embodiments, systems are provided for detecting one or more internal faults in an electrochemical cell that include a first electrochemical cell with a first terminal and a first opposite terminal; a second electrochemical cell with a second terminal and a second opposite terminal. The first terminal and the second terminal have a common polarity, in that the first terminal and the second terminal are either positive or negative. The system optionally further includes a voltage measurement device, in which the first terminal and the second terminal connected in common, optionally to a single bus. The first opposite terminal and the second opposite terminal include an open circuit; and the voltage measurement device is electrically connectable or connected to the first opposite terminal and the second opposite terminal.

BRIEF DESCRIPTION OF THE DRAWINGS

The embodiments set forth in the drawings are illustrative and exemplary in nature and not intended to limit the subject matter defined by the claims. The following detailed description of the illustrative aspects can be understood when read in conjunction with the following drawings in which:

Figure 1:
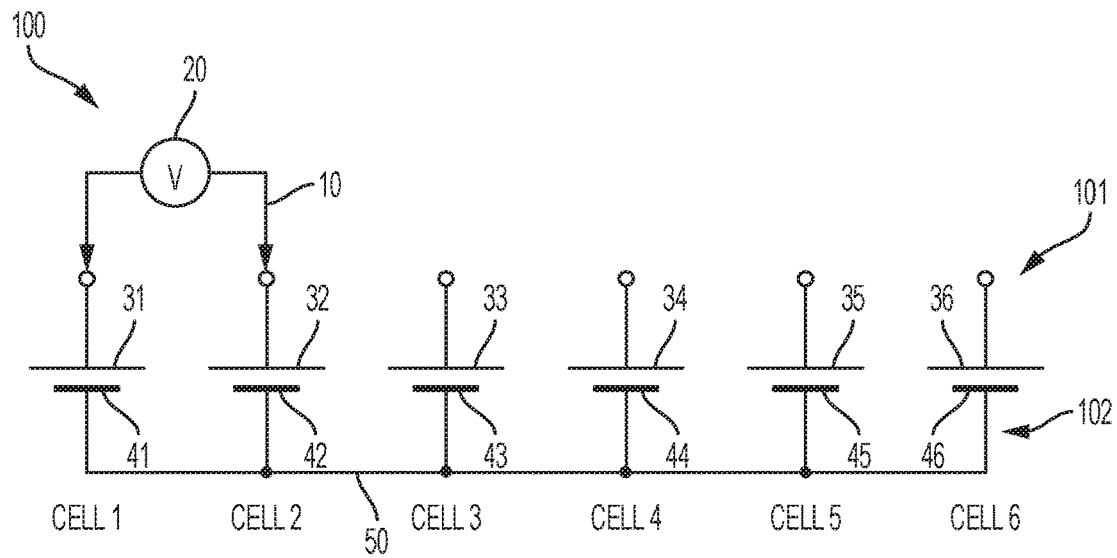
FIG. 1 is an illustration of an array of six cells with negative terminals connected in common and positive terminals in an open-circuit.

The embodiments set forth in the drawings are illustrative in nature and not intended to be limiting to the claims. Moreover, individual features of the drawings will be more fully apparent and understood in view of the detailed description.

DETAILED DESCRIPTION

The following description is merely exemplary in nature and is in no way intended to limit the scope of the disclosure, its application, or uses, which may, of course, vary. The description is presented with relation to the non-limiting definitions and terminology included herein. These definitions and terminology are not designed to function as a limitation on the scope or practice of the disclosure but are presented for illustrative and descriptive purposes only. While the processes or systems are described as an order of individual steps or using specific materials, it is appreciated that steps or components in the system may be interchangeable such that the description may include multiple parts or steps arranged in many ways as is readily appreciated by one of skill in the art.

It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed in the following paragraphs could be termed a second (or other) element, component, region, layer, or section without departing from the teachings herein.

As used herein, the singular forms "a," "an," and "the" are intended to include the plural forms, including "at least one," unless the content clearly indicates otherwise. As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "or a combination thereof" means a combination including at least one of the foregoing elements.

Unless otherwise defined, all terms (including technical and scientific terms) used herein have the same meaning as commonly understood by one of ordinary skill in the art to which this disclosure belongs. It will be further understood that terms such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein the term "differential voltage" is defined as the difference in voltage between a first cell and a second cell measured at terminals of the same polarity.

Embodiments of the system for measuring internal fault of an electrochemical cell will now be described with reference to FIG. 1. According to one or more embodiments, an exemplary system is configured for measuring one or more internal faults of an electrochemical cell. The system 100 shows an array 50 of cells, Cells 1-6. Cell 1 includes a first terminal 41 and a first opposite terminal 31. In some embodiments, the first terminal 41 is negative and the first opposite terminal 31 is positive. In other embodiments, the first terminal 41 is positive and the first opposite terminal 31 is negative.

Each of the electrochemical cells in array 50 has a positive and negative terminal. The negative terminals may collectively be referred to as negative terminals 41, 42, 43, 44, 45, and 46. The terminals (for example, the negative terminals) may be alternatively referred to as first terminal 41, second terminal 42, third terminal 43, fourth terminal 44, fifth terminal 46, and sixth terminal 46. The positive terminals may collectively be referred to as positive terminals 31, 32, 33, 34, 35, and 36. The terminals having opposite polarity (for example, the positive terminals) may be alternatively referred to as first opposite terminal 31, second opposite terminal 32, third opposite terminal 33, fourth opposite terminal 34, fifth opposite terminal 36, and sixth opposite terminal 36.

In one or more embodiments, the system 100 includes negative terminals 41, 42, 43, 44, 45, and 46 connected in common 102 and positive terminals 31, 32, 33, 34, 35, and 36 in an open-circuit 101. A voltage measurement device 20 is electrically connectable or connected to a first terminal 31 and a second terminal 32 via circuit 10. The first terminal 31 and the second terminal 32 have the same polarity, in that the terminal is either positive or negative. The system 100 detects a voltage difference via a voltage measurement device 20. This difference may be tracked over a period of time. In some embodiments, any two cells of the array 50 may be electrically connected or connectable via circuit 10. For example, Cell 2 may be connected to Cell 5, in that second terminal 42 and fifth terminal 45 are electrically connected via circuit 10. The voltage difference or rate of change of voltage may be achieved between any two cells in the test array 50 and is not limited to adjacent cells.

In some embodiments, the systems and processes according to this disclosure utilize a reference cell. Optionally using a reference cell, the system is able to detect anomalous self-discharge due to a 125,000 ohm load (optionally as a simulated internal short or as a measure of an actual internal short) in approximately 15 minutes, as compared to approximately 14 days using prior methodologies. Prior to the screening, the reference cell is optionally tested and determined to be substantially free of internal shorts or alternatively determined to have an internal short of a known level. The use of a standard reference cell in a process was further able to detect a 1,000,000 ohm simulated short in less than one hour. Cell internal faults of such high resistance are not detected by prior methods.

Figure 2A:
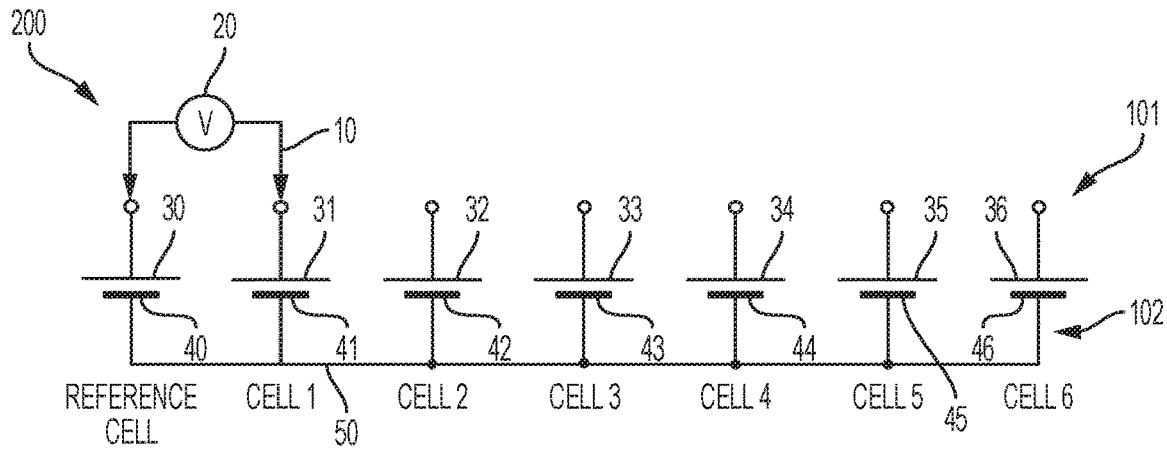
FIG. 2A illustrates an array of six test cells and a reference cell, in which the voltage between the positive terminal of test cell 1 is measured versus the positive terminal of the reference cell, and the reference cell is initially screened as being substantially free of internal shorts.
Figure 2B:
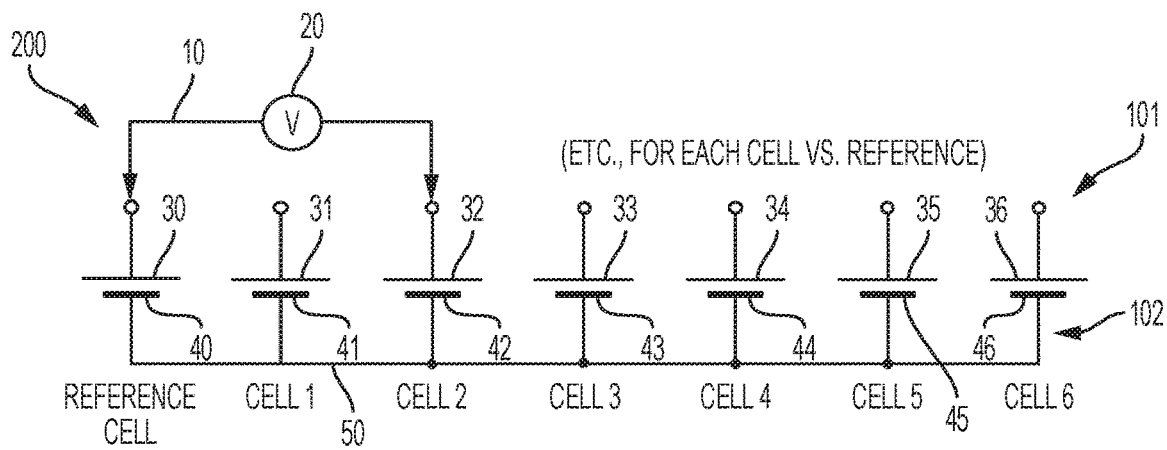
FIG. 2B illustrates an array of six test cells and a reference cell, in which the voltage between the positive terminal of test cell 2 is measured versus the positive terminal of the reference cell, and the reference cell is initially screened as being substantially free of internal shorts.

Embodiments of the system for measuring the presence or absence of one or more internal faults of an electrochemical cell will now be described with reference to FIGS. 2A-2B. According to one or more embodiments, an exemplary embodiment of system may be configured for measuring internal fault of an electrochemical cell. The system 200 shows the array 50 of cells including a Reference Cell and Cells 1-6, with negative terminals 41, 42, 43, 44, 45, and 46 connected in common 102, positive terminals 31, 32, 33, 34, 35, and 36 in an open-circuit 101, and a voltage measurement device 20. In FIG. 2A, the voltage measurement device 20 electrically connects or is electrically connectable to the reference terminal 30 of the Reference Cell and a first terminal 31 via a circuit 10. In FIG. 2B, the voltage measurement device 20 electrically connects or is electrically connectable to the reference terminal 30 of the Reference Cell and a second terminal 32 via a circuit 10. While FIG. 2A illustrates the circuit 10 connecting the Reference Cell and Cell 1, and FIG. 2B illustrates the circuit 10 connecting the Reference Cell and Cell 2, each individual cell may be connected to the reference cell via circuit 10. In FIGS. 2A and 2B, the system 200 tests the voltage difference between one of positive terminals 31, 32, 33, 34, 35, and 36 of Cells 1-6 in comparison to the positive terminal 30 of a reference cell. It is appreciated that the use of a reference cell in FIGS. 2A and 2B is for illustrative purposes alone. A reference cell is optional and not required as the process may be performed between two cells where neither cell is a reference cell.

In other embodiments, the positive terminals 31, 32, 33, 34, 35, and 36 of the Cells 1-6 may be bussed together or connected in common 102 and the negative terminals 41, 42, 43, 44, 45, and 46 left open circuit 101. The voltage measurement device 20 is connected across two of the negative terminals 41, 42, 43, 44, 45, and 46 via circuit 10 to detect the presence of an internal short circuit as described above.

In one or more embodiments, the system 200 includes at least one Reference Cell of known status, such as known to be absent an internal fault or known to include an internal fault of a particular type or magnitude. In system 200, one or more than one of Cells 1-6 in the array 50 are compared against the Reference Cell. In some embodiments, although not required, the Reference Cell and the test cells, one of Cells 1-6, possess substantially the same capacity, chemistry, and substantially identical terminal voltages prior to the test. In some embodiments, the Reference Cell is known by prior determination using one or more methods to be free of any detectable short or other internal fault by, for example, observing stable open circuit voltage of the cell for an extended period of time, such as 6 months.

In one or more embodiments, the Reference Cell may be quantified to the extent at which the reference cell provides a stable voltage reference. If, for example, the Reference Cell shows a decline in open circuit voltage of 1 mV over a period of 6 months, and the Reference Cell has been characterized to determine that a change in voltage of 1 mV corresponds to a change in state-of-charge of, for example, 0.1%, then for a cell 2.6 Ah in capacity, the 1 mV loss corresponds to a discharge of 0.026 Ah in the 6 month period, or a current of 0.026 Ah/(4320 h)=6 µA. Thus, the Reference Cell may be determined to have an internal short of 6 µA in average value.

In one or more embodiments, processes are performed on the array 50 as illustrated by the system 100 in FIG. 1 to measure the voltage difference or rate of change in the voltage difference to determine internal fault of an electrochemical cell. All or portions of the cell terminals of one polarity (for example, the negative terminals 41, 42, 43, 44, 45, and 46) are connected in common 102 while leaving all of the terminals of the opposite polarity, positive terminals 31, 32, 33, 34, 35, and 36, not connected or in an open circuit 101. The voltage measurement device 20 is electrically connected or electrically connectable via circuit 10 across the positive terminal 31 of Cell 1 and positive terminal 32 of Cell 2 for a measurement time during which voltage difference or rate of change in voltage difference is measured. As an illustration, during this measurement time, the voltage difference between the positive terminal 31 of Cell 1 and the positive terminal 32 of Cell 2 is monitored, and a determination made with respect to the rate of change of that voltage difference. In some embodiments, the process is repeated with the voltage measurement device connected to the positive terminal 32 of Cell 2 and the positive terminal 33 of Cell 3, followed by connection to the positive terminal 33 of Cell 3 and the positive terminal 34 of Cell 4, and so forth until each adjacent pair of cells has been measured. The presence of an internal short is indicated by a cell showing a positive terminal voltage that becomes increasingly negative with respect to the other cells in the group. The measurement may also be carried out by measuring the voltage between the positive terminal of each of Cell 2-6 with respect to Cell 1 (i.e., measure the positive terminal of Cell 2 vs. Cell 1, then Cell 3 vs. Cell 1, then Cell 4 vs. Cell 1, and so forth).

In other embodiments, it may be understood that the system and processes are equally applicable if, instead of connecting or bussing all negative terminals 41, 42, 43, 44, 45, and 46 of Cells 1-6 and measuring the voltage difference between positive terminals, all of the positive terminals 31, 32, 33, 34, 35, and 36 of Cells 1-6 may be connected in common 102 or bussed and the voltage different measured by forming a circuit 10 between the negative terminals 41, 42, 43, 44, 45, and 46 of Cells 1-6. The electrical response of the measured voltage will be complementary in that the negative terminal of a test cell with an internal short will become increasingly positive with respect to the negative terminal of a cell without a short.

In one or more embodiments, the test array 50 includes at least two cells. The maximum number of cells is not specifically limited. In some embodiments, the number of cells is from 2 to 1000, or any value or range therebetween. A test array optionally includes 2, 3, 4, 5, 6, 7, 8, 9, 10, or more than 10 cells. FIG. 1 illustrates an array having six cells, and FIGS. 2A and 2B illustrate arrays having seven cells.

Described within this disclosure are processes for detection of internal defects in an electrochemical cell, such as a cell employed in a battery or battery system. A process utilizes two or more cells arranged in a test array with a first terminal of the same electrical polarity of each cell connected in common and a second terminal of opposite electrical polarity of each cell in open-circuit. The process includes connecting a voltage measurement device between pairs of the second terminals and measuring the voltage difference or the rate of change of voltage difference between open-circuit terminals for a time measurement. An increase in voltage difference over time, optionally above a predetermined threshold, of a first cell relative to a second cell is indicative of a fault in the first cell.

In embodiments, processes include measuring the voltage or rate of change of voltage of at least two cells for a measurement time. A measurement time is optionally from 1 minute to 5 days. In some embodiments, a measurement time is 24 hours or less, optionally 12 hours or less, optionally 10 hours or less, optionally 9 hours or less, optionally 8 hours or less, optionally 7 hours or less, optionally 6 hours or less, optionally 5 hours or less, optionally 4 hours or less, optionally 3 hours or less, optionally 2 hours or less, optionally at or less than one hour. In some embodiments, a time measurement is from 1 minute to 60 minutes, optionally 10 minutes to 60 minutes, optionally 20 minutes to 60 minutes, optionally 30 minutes to 60 minutes. With time measurements of several days or less, e.g. 5 days, great improvement in test throughput is achieved over prior methods.

In one or more embodiments, measurements between any two cells may be performed simultaneously using multiple voltage measurement devices, or are performed in rapid succession utilizing a voltage measurement device multiplexed across multiple cell terminals. As used herein the term "rapid" is used to describe time from the start of one measurement to the start of the second measurement of 5 seconds or less. In some embodiments the time from the start of one measurement to the start of the succeeding measurement is 1 second or less, optionally less than one second.

While implementing the process according to any one of the embodiments in this disclosure, a cell with an internal short of less than 6 µA (as an illustration) may show a voltage difference from its positive terminal versus the positive terminal of the reference cell that increases with time. The difference of the voltage between the test cell and the reference cell increases with time because the test cell has a lower magnitude internal short, if any, than the reference cell. If the test cell has an internal short greater than 6 µA, then the voltage between the positive terminal of the test cell and the positive terminal of the reference cell will change such that positive terminal of the reference cell becomes increasingly positive with respect to the test cell.

A step of detecting the presence or absence of an internal fault, optionally al short or self-discharge, is performed by detecting the presence or absence of a differential voltage or rate of change of differential voltage between two electrochemical cells where the differential is optionally less than 1 milliVolt (mV) or where a rate of change of differential voltage is 0.1 microVolts per hour (µV/hr). When measuring voltage difference at the end of the measurement time the voltage difference is optionally less than 900 microVolts (µV), optionally less than 800 µV, optionally less than 700 µV, optionally less than 600 µV, optionally less than 500 µV, optionally less than 400 µV, optionally less than 300 µV, optionally less than 200 µV, optionally less than 100 µV, optionally less than 50 µV, optionally less than 10 µV, optionally less than 1 µV. When measuring a rate of change of differential voltage, a detection slope over the measurement time may be determined whereby the detection slope is optionally less than 0.1 µV/hr, optionally less than 0.05 µV/hr, optionally less than 0.04 µV/hr, optionally less than 0.03 µV/hr, optionally less than 0.02 µV/hr, optionally less than 0.01 µV/hr. A measurement time for detection of rate of change of rate of change of differential voltage is optionally 2 hours or less, optionally 1 hour or less, optionally 30 minutes or less, optionally 20 minutes or less, optionally 10 minutes or less.

In embodiments, the voltage difference or rate of change of voltage difference measurement is accomplished using a voltage measurement device 20. Any suitable voltage measurement device may be used. In some embodiments, a voltage measurement device 20 is a high resolution voltage measurement device as that term is recognized in the art. Illustrative examples of a high resolution voltage measurement devices include devices capable of voltage resolution optionally in the sub-microvolt range, optionally the sub-nanovolt range. In one or more embodiments, the voltage measurement device 20 is a high resolution voltage measurement device having a 1 microvolt or less than 1 microvolt resolution. Examples of such voltage measurement devices include the Hewlett-Packard HP34401A multimeter (1 microvolt resolution) and the Keithley DMM7510 multimeter (10 nanovolt resolution).

Several key attributes arise from process as described above that result in extremely high sensitivity. The voltage measurement device 20 measures a relatively small voltage, perhaps only a few mV or less. In some embodiments, the process of this disclosure is optionally performed with all cells at the same or substantially the same state-of-charge, and thus, each cell in the test array 50 yields a similar voltage output. Regardless of the degree of resolution the voltage measurement device, the voltage measurement device can be concentrated entirely on that small measurement range. Measurement of the voltage differential between two electrically common (such as positive or negative) terminals of two cells may deliver much higher sensitivity than measurement of simple cell voltage—positive to negative of the same cell. A high performance voltmeter can deliver between two to four orders of magnitude greater voltage measurement resolution at 1 millivolt (mV) full scale.

In one or more embodiments, the voltage measurement device 20 may include a voltage measurement circuit designed for a maximum full-scale reading of 1 to 2 mV that can deliver voltage measurement resolution in the sub nanovolt (nV) range. For example, 16 bits of significant measurement data (which is above what is considered to be "noise" in the industry) on a 2 mV full scale measurement corresponds to 31 picovolt (pV) resolution. Very small changes in the voltage of an individual cell are associated with very high resistance, and low current shorts are beyond the measurement resolution of even high-resolution instrumentation. In contrast, for example, a five to ten volt (V) full scale is required to measure the full individual cell voltage. The purpose-designed voltage measurement system is designed to measure a maximum voltage of 1 mV can deliver up to 4200 times the resolution of a system that must accommodate full cell voltage of up to 4.2 V. However, utilizing the processes as described in this disclosure, even at high resistance, low current shorts can be detected and quantified.

Additional attributes of the processes as described in this disclosure are that variations in cell voltage with temperature appear as a substantially common-mode parameter (meaning that it is substantially rejected by the measurement). Accordingly, using the disclosed process, it is possible to discern voltage changes of a cell resulting from an internal fault, such as an internal short, that would otherwise be masked by cell voltage changes due to temperature. Since each test cell experiences substantially the same positive-to-negative terminal voltage changes due to temperature, the voltage measured between positive terminals of the cells with negative terminals connected has reduced (or largely zero) change due to cell temperature variations. However, not intending to be limited, it is noted that when using the systems and processes of this disclosure, the cells stored and tested in a controlled thermal environment do not typically experience wide temperature fluctuation(s). The processes afford sensitivity to voltage changes due to internal faults that would be hidden to methods in the prior art, those changes being hidden because a fault that causes a voltage change that is small compared to the voltage change of the cell due to changes in temperature is masked. The systems and processes of this disclosure overcome this deficiency by utilizing a measurement structure in which voltage is measured between terminals of the same polarity of different cells, with the opposite polarity terminals connected in common, so that as cell voltages change with temperature, the changes are a common-mode signal that is substantially rejected by the measurement structure.

The system and processes as described herein can be utilized in various applications including but not limited to: screening cells for an internal short as part of the formation or aging process in lithium-ion cell manufacture; screening cells for internal shorts prior to assembly of those cells into a battery pack; testing cells for the presence of an internal short in laboratory research; measurement of state-of-health of cells with respect to safety; or detection of internal shorts and/or measurement of self-discharge in cells including cells of the lithium-ion, lead-acid, nickel-metal hydride, and nickel-cadmium chemistries. It is appreciated that while the description is primarily directed to lithium-ion cells that cells of any chemistry may be employed in the processes or systems as provided herein.

EXEMPLARY ASPECTS

It should now be understood that the various aspects of the process of detecting internal fault in a battery and the system for detecting internal fault in a battery are described and such aspects may be utilized in conjunction with various other aspects In a first aspect, the disclosure provides processes for detecting one or more internal faults, optionally a short or self-discharge, in an electrochemical cell includes: measuring a voltage difference or a rate of change in voltage difference between a test terminal of a first electrochemical cell and a test terminal second electrochemical cell where the test terminals are of the same polarity, wherein the measuring is for a measurement time; and accepting the first electrochemical cell or second electrochemical cell based on the measuring; or discarding the first electrochemical cell or second electrochemical cell based on the step of measuring identifying one or more internal faults in the first or second electrochemical cell.

In second aspect, the disclosure provides the process of the first aspect in which the process further includes measuring a voltage difference or a rate of change in voltage difference between the test terminals of: (A) the first electrochemical cell or the second electrochemical cell, and (B) a test terminal of the same polarity in a third electrochemical cell for a second time measurement.

In a third aspect, the disclosure provides the process for the first aspect or the second aspect, in which the measurement time is from 1 second to 24 hours, optionally 2 to 3 hours.

In a fourth aspect, the disclosure provides the process of any of aspects 1 through 3 or 5 through 15, in which each of the first electrochemical cell and the second electrochemical cell is a lithium-ion cell.

In a fifth aspect, the disclosure provides the process of any of the first through fourth aspects, in which the internal fault is a short.

In a sixth aspect, the disclosure provides the process of any of the first through fourth aspects, in which the internal fault is not a short.

In a seventh aspect, the disclosure provides the process of any of the first through sixth aspects, in which the first electrochemical cell or the second electrochemical cell is a reference cell comprising a known and optionally measured internal fault or a known absence of an internal fault.

In an eighth aspect, the disclosure provides the process of any of the first through seventh aspects, in which the first electrochemical cell and the second electrochemical cell are at a same temperature, state of charge, or both the same temperature and state of charge.

In a ninth aspect, the disclosure provides the process of any of the first through eighth aspects, in which wherein the common terminal is positive.

In a tenth aspect, the disclosure provides the process of any of the first through eighth aspects, in which the common terminal is negative.

In a eleventh aspect, the disclosure provides a system for detecting an internal fault in an electrochemical cell includes a first electrochemical cell with a first terminal and a first opposite terminal, a second electrochemical cell with a second terminal and a second opposite terminal, and a voltage measurement device. The first terminal and the second terminal have the same polarity. The first terminal and the second terminal are connected in common, optionally to a single bus. The first opposite terminal and the second opposite terminal each in open circuit. The voltage measurement device is electrically connectable or connected to the first opposite terminal and the second opposite terminal.

In a twelfth aspect, the disclosure provides the system of the eleventh aspect, in which the array comprises two to ten electrochemical cells.

In a thirteenth aspect, the disclosure provides the system of the eleventh to twelfth aspects, in which the array further comprises a reference cell having a reference terminal and an opposite reference terminal.

In a fourteenth aspect, the disclosure provides the system of the thirteenth aspect, in which wherein the first terminal, the second terminal, and the reference terminal are connected in common; and the voltage measurement device is electrically connectable or connected to the first terminal and the reference terminal, or the voltage measurement device is electrically connectable or connected to the second terminal and the reference terminal In fifteenth aspect, the disclosure provides the system of the eleventh to the fourteenth aspects, in which the voltage measurement device comprises a high resolution voltage measurement device having a 1 microvolt or less than 1 microvolt resolution.

Various embodiments of the present disclosure are illustrated by the following non-limiting examples. The examples are for illustrative purposes and are not a limitation on any practice of the present disclosure. It will be understood that variations and modifications can be made without departing from the spirit and scope of the disclosure.

EXPERIMENTAL EXAMPLES

Certain embodiments described in the foregoing Detailed Description will be further clarified by the following Examples. It should be understood that the following examples are not intended to limit the scope of the embodiments described in the Detailed Description or recited in the claims.

Example 1

For Example 1, data was acquired using an exemplary system and process in which two commercially available 2.6 Ah 18650 cells were connected with the negative terminals connected in common to form a two cell test array and the positive terminals remaining open-circuit. Voltage between the positive terminals of the cells were measured using a Keithley DMM7510 multimeter and tracked over a period of up to approximately two hours.

An internal short circuit was simulated by placing a load resistance across one of the cells, and the voltage between the positive terminals of the cells tracked for a period of time. The resulting data was plotted for trials in which the load resistance simulating an internal short was 125 kiloohm (k$\Omega$), 250 k$\Omega$, 500 k$\Omega$, and 1 megaohm (Me). The no short condition for the pair of cells is the bottom trace. The data, as recorded in the graph of FIG. 3, showed the response for the no-short condition, which was a flat line labeled "no short", and the response for a range of resistances corresponding to low level, difficult-to-detect internal short circuits.

Figure 3:
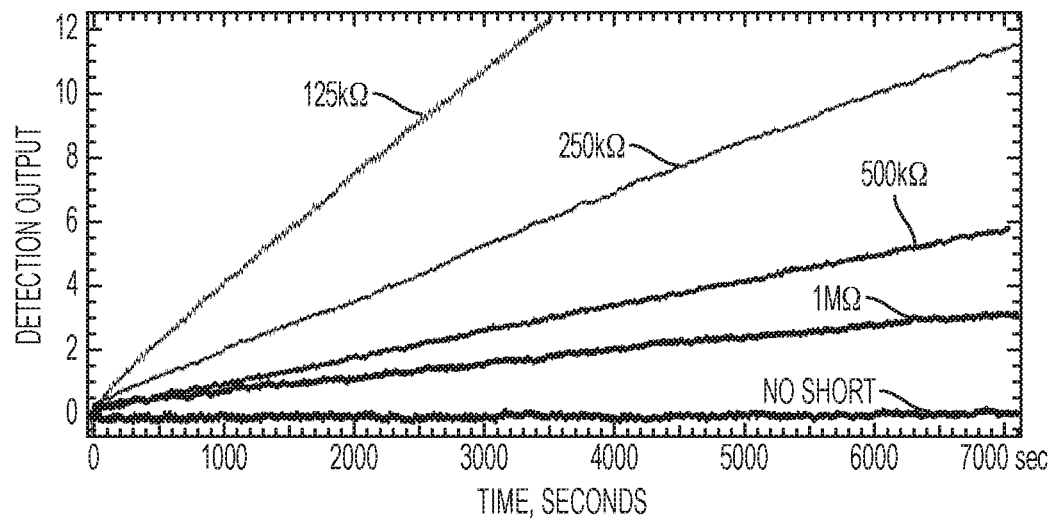
FIG. 3 is a graph utilizing the process and system described in this disclosure, wherein the negative terminals of two commercial cells are connected and a high-resolution voltmeter connected across the positive terminals of the cells and the resulting data is plotted for trials in which the load resistance simulating an internal short was 125 kΩ, 250 kΩ, 500 kΩ, and 1 MΩ and where the no short condition for the pair of cells is the bottom trace.

The results in the graph of FIG. 3 indicated that difficult-to-detect resistance levels, such as 1 Me, 500 k$\Omega$, 250 k$\Omega$, and 125 k$\Omega$, are readily and rapidly detected using the system and process previously described. The data collected and shown in the graph of FIG. 3 is recognized as a relative measurement of the levels of self-discharge within the two cells. Since the process according to Example 1 is sensitive, the differences in even very small levels of self-discharge within the cells are detectable.

Comparatively, chemical degradation processes can consume charge within a cell and while such process of Example 1 did not involve direct electronic conduction across the separator. As in the case of an internal short, the process resulted in a decline in open circuit voltage of the cell. Cells of comparable, normal levels of self-discharge delivered a relatively flat response, no short trace in the graph of FIG. 3. Cells with greater self-discharge, from any source whether electronic conduction across the separator in an internal short, or via electrochemical processes that consume charge by other mechanisms, would be identified using the system and process of Example 1 and could be rejected accordingly.

The conventional approach to monitoring internal short circuits, which consisted of measuring the open circuit voltage across opposing terminals of the same cell, did not register any change over the time period of the measurements shown in the graphs of FIG. 3. The results in the graph of FIG. 3 highlighted one benefit of the process of Example 1 for rapid, accurate detection of internal short circuits in lithium-ion cells.

Figure 4:
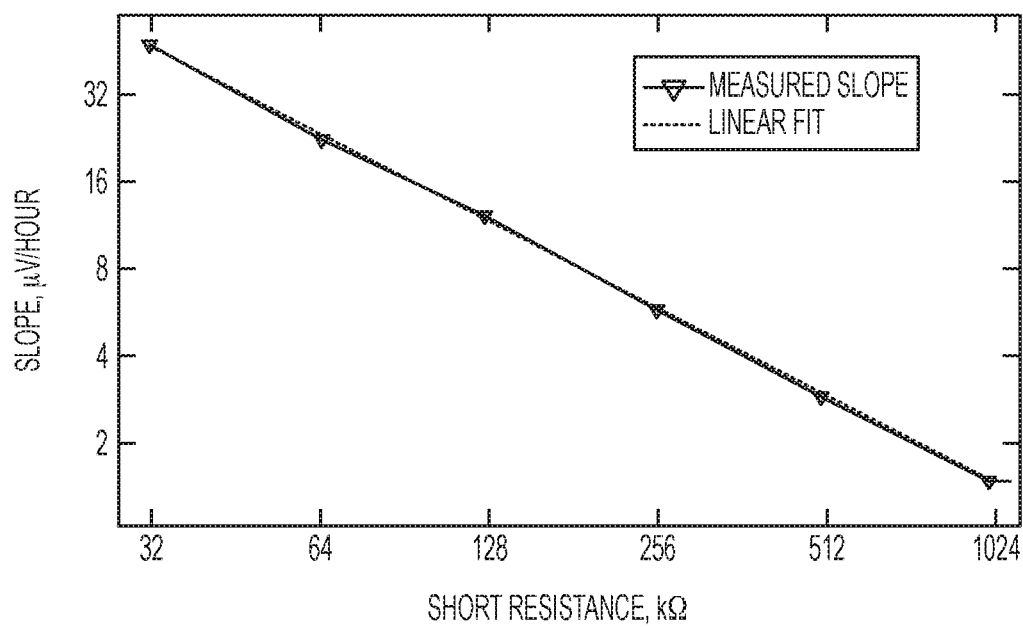
FIG. 4 is a graph of the data collected and as shown in FIG. 3 where the slope for each trace is plotted as a function of short resistance, and a linear fit of log(slope) versus log(short resistance)

Each data point recorded in the graph of FIG. 4 was the slope for each trace plotted versus short resistance, and a linear fit of log(slope) as a function of log(short resistance). The data was derived from the responses shown in FIG. 3. The data showed that the degree of the slope depended on the magnitude of the resistance. Since the slope showed a well-behaved dependence on the magnitude of short resistance, the slope was used to quantify the magnitude of an internal short for a given cell type, as shown in FIG. 4.

Example 2

For Example 2, data was acquired using an exemplary system and process in which eight commercially available 2.6 Ah 18650 cells were connected with the negative terminals connected in common to form an eight cell test array and the positive terminals remaining open-circuit, similar to system illustrated in FIG. 1. Voltage between the positive terminals of the cells was measured using a Keithley DMM7510 multimeter and tracked over a period of approximately four and one-half hours.

Figure 5:
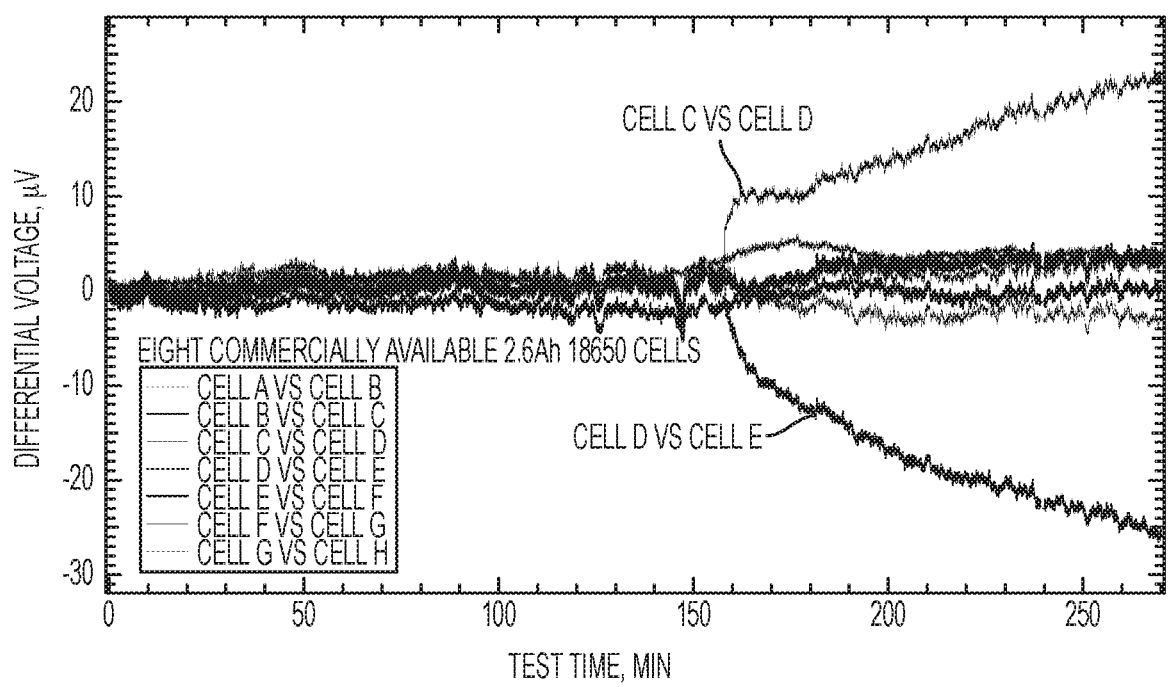
FIG. 5 is a graph measuring differential voltage as a function of time for eight commercially available cells and where a 100,000 ohm resistance is placed on Cell D to simulate an internal short at 160 minutes.
Figure 6:
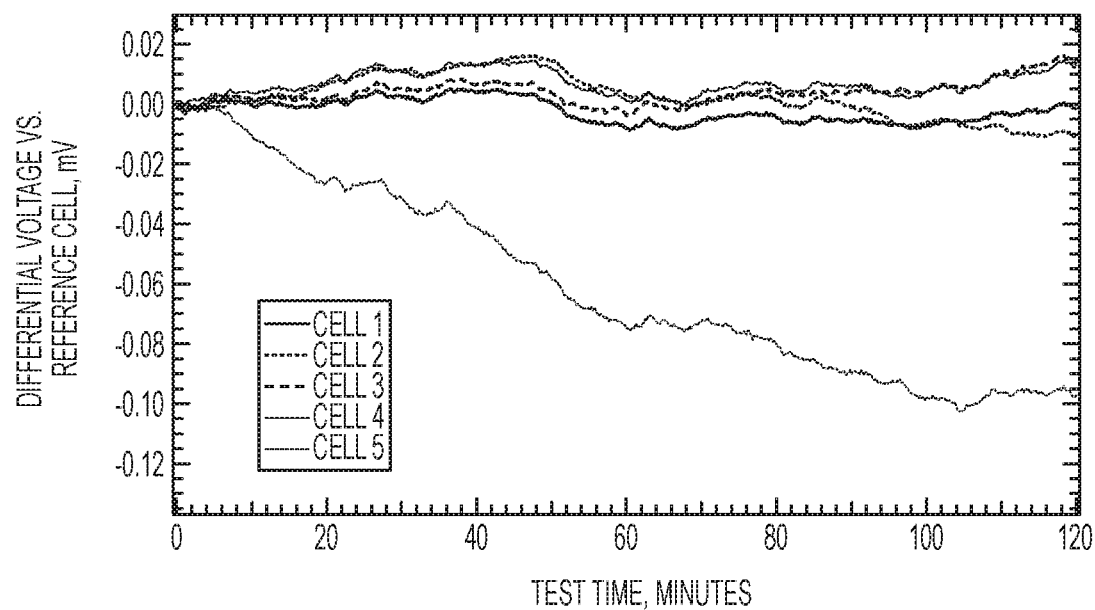
FIG. 6 is a graph measuring the differential voltage of individual cells to be screened versus a Reference Cell as illustrated in FIGS. 2A and 2B.
Figure 8:
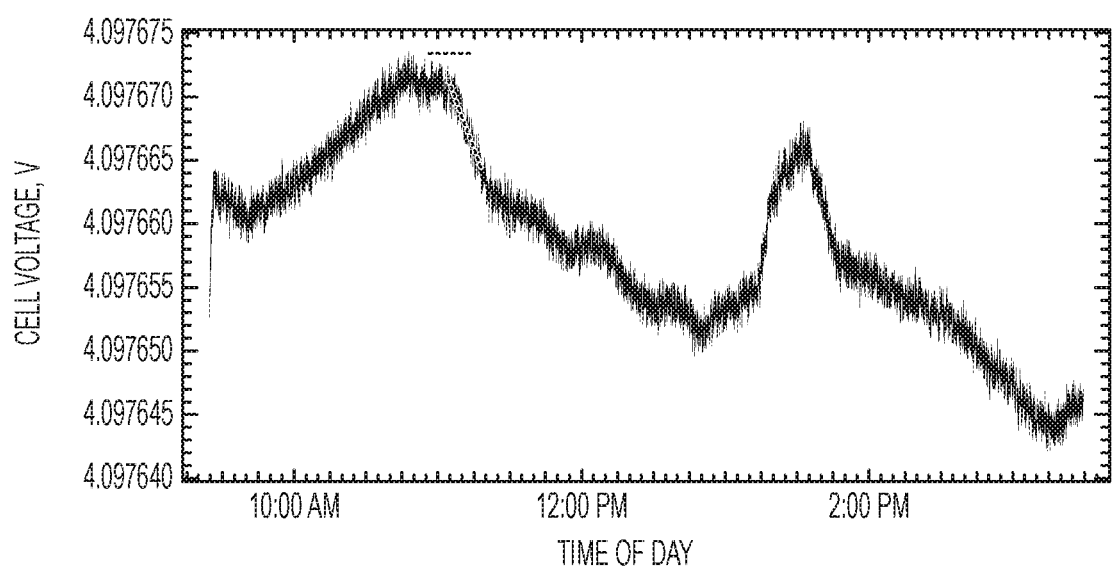
FIG. 8 is a graph of cell voltage as a function of time where the cell voltage increases and decreases with ordinary minor fluctuations in ambient temperature.

In Example 2, the differential voltage (voltage difference) was monitored between each cell and the cells immediately adjacent to that cell, and the results were recorded and shown in a group of FIG. 5. In approximately the first 160 minutes of the test, the cells were tested without the presence of a 100,000 ohm resistance. The fluctuations in differential voltage (voltage difference) that occurred in the graph of FIG. 5 were typical with small fluctuations in ambient temperature as shown in the graph of FIG. 8.

In the graph of FIG. 5, at approximately 160 minutes, a 100,000 ohm resistance was placed across Cell D. The 100,000 ohm resistance was incorporated into the system to simulate an internal short. As previously described, the presence of the internal short was indicated by the cell showing a positive terminal voltage that became increasingly negative with respect to the other cell in the group. In the graph of FIG. 5, when the voltage of Cell D was measured in comparison to Cell E (Cell D vs Cell E), the differential voltage (voltage difference) became increasingly negative as a function of time, because the Cell D voltage fell or decreased in comparison to Cell E. Comparatively, when Cell C was measured in comparison to Cell D, the differential voltage became increasingly positive over a period of time. The differential voltage increased, because the Cell C voltage increased comparative to Cell D.

Cells A, B, C, E, F, G, and H when tested against the adjacent cell (not including Cell D) did not indicated the presence of an internal short as there was no increase or decrease of differential voltage.

Example 3

In Example 3, five commercial lithium-ion cells were tested using the configuration shown in FIGS. 2A and 2B. Differential voltage of each cell was measured versus a reference cell. Cell 5 was identified as having anomalous self-discharge by the negative slope of the Cell 5 differential voltage vs the reference cell over time. Over a period of ten months Cell 5 was observed at rest (room temperature storage). Test results indicated that the cell slowly discharged from an initial voltage of 3.78 volt (V) to a voltage of less than 1.5 V over a period of ten months, confirming the presence of a high-resistance internal short. These cells presumably passed the manufacturers quality control tests prior to sale. However, Cell 5 was rapidly diagnosed as containing an internal short using one of the processes described in this disclosure.

Example 4

Figure 7A:
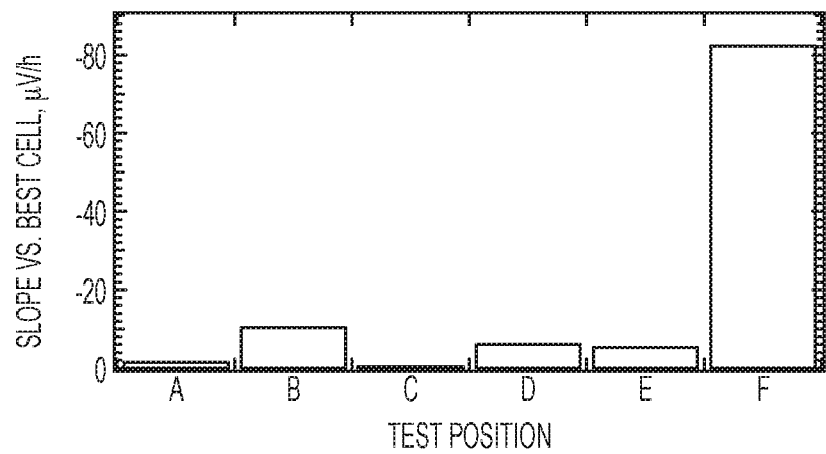
FIG. 7A illustrates the differential voltages measured using processes as described herein as a function of time of 6 cells obtained from Manufacturer A illustrating an internal fault in cell F.
Figure 7B:
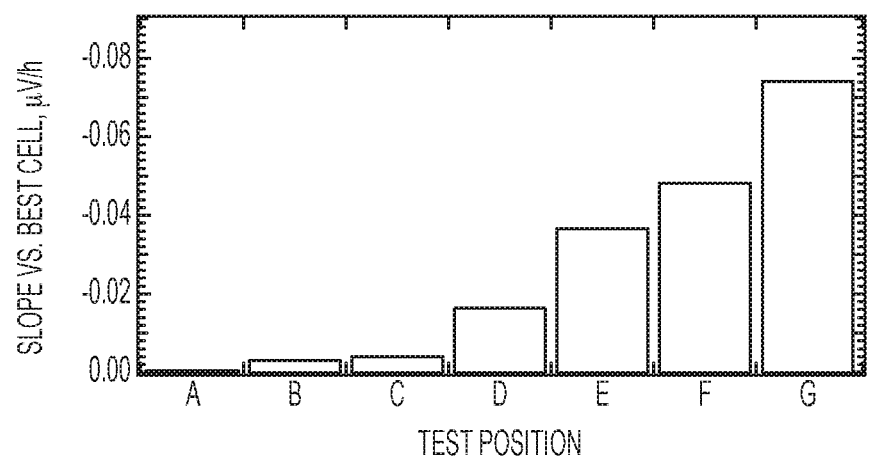
FIG. 7B illustrates the differential voltages measured using processes as described herein as a function of time of 6 cells obtained from Manufacturer B showing low values for change in differential voltage over time associated with cells substantially free of internal shorts.

In the bar graphs of FIGS. 7A-7B, two groups of purchased cells from different manufacturers were tested according to the system and process of this disclosure. The cells from Manufacturer A showed higher slopes of differential voltages as a function of time in comparison to the slopes of differential voltages of the cell from Manufacturer B. Comparatively, the cells from Manufacturer A had slopes of differential voltages 1000 times greater than the differential slopes of the cells from Manufacturer B. The increase in slopes of differential voltage indicted the presence of soft shorts in some cells of Manufacturer A. The presence of soft shorts in cells from Manufacturer A, and absence of such shorts in the cells from Manufacturer B, was confirmed by tracking of cell voltage over a period of 10 months. For example, the cell from Manufacturer A, test position F, discharged from 3.78 V to 1.3 V in ten months (corresponding to an estimated short resistance of approximately 25,000 ohms. By contrast, cell F from Manufacturer B lost less than 1 mV in twelve months.

Example 5

In Example 5, and as shown in the graph of FIG. 8, the voltage of a cell was studied as a function of time throughout a day. The voltage of the cell increased and decreased with ordinary minor fluctuations in ambient temperature (22.5±2.0 degrees Celsius (° C.)). The minor fluctuation in cell voltage demonstrated the ability of a differential measurement between two cells to reject the common-mode variation in voltage of the cells. Thus, temperature-induced fall in cell voltage is avoided for the presence of an internal short in a short-free cell.

Various modifications of the present disclosure, in addition to those shown and described herein, will be apparent to those skilled in the art of the above description. Such modifications are also intended to fall within the scope of the appended claims.

All materials and instruments were obtainable by sources known in the art unless otherwise specified.

Patents, publications, and applications mentioned in the specification are indicative of the levels of those skilled in the art to which the invention pertains. These patents, publications, and applications are incorporated herein by reference to the same extent as if each individual patent, publication, or application was specifically and individually incorporated herein by reference.

It should be apparent to those skilled in the art that various modifications can be made to the described embodiments without departing from the spirit and scope of the claimed subject matter. Thus, it is intended that the specification cover modifications and variations of the described embodiments provided such modification and variations come within the scope of the appended claims and their equivalences.

The invention claimed is:

1. A system for detecting an internal fault in an electrochemical cell comprising:
   an array of electrochemical cells having at least three electrochemical cells, the array comprises a reference cell having a reference terminal and an opposite reference terminal; a first electrochemical cell having a first terminal and a first opposite terminal; and a second electrochemical cell having a second terminal and a second opposite terminal, the first terminal, the second terminal, and the reference terminal having a common polarity; and
   a voltage measurement device;
   wherein
   the reference terminal, the first terminal and the second terminal are connected in common;
   the first opposite terminal and the second opposite terminal each in open circuit; and
   the voltage measurement device is electrically connectable or connected to the first opposite terminal and the opposite reference terminal, or the voltage measurement device is electrically connectable or connected to the second opposite terminal and the opposite reference terminal.

2. The system of claim 1, wherein the array comprises three to ten electrochemical cells.

3. The system of claim 1, wherein the voltage measurement device comprises a high resolution voltage measurement device having a 1 microvolt or less than 1 microvolt resolution.

* * * * *